(12) United States Patent
Makita et al.

(10) Patent No.: US 9,128,147 B2
(45) Date of Patent: Sep. 8, 2015

(54) TEST HEAD, TEST BOARD AND TEST APPARATUS

(75) Inventors: Daisuke Makita, Tokyo (JP); Mitsuru Fukuda, Tokyo (JP); Toru Honobe, Kanagawa (JP)

(73) Assignee: ADVANTEST CORPORATION, Tokyo (JP)

( * ) Notice: Subject to any disclaimer, the term of this patent is extended or adjusted under 35 U.S.C. 154(b) by 884 days.

(21) Appl. No.: 13/368,339

(22) Filed: Feb. 8, 2012

(65) Prior Publication Data

US 2012/0280705 A1      Nov. 8, 2012

Related U.S. Application Data

(63) Continuation of application No. PCT/JP2011/000983, filed on Feb. 22, 2011.

(30) Foreign Application Priority Data

May 20, 2010   (JP) ................................. 2010-116617

(51) Int. Cl.
    *G01R 31/00*   (2006.01)
    *G01R 31/28*   (2006.01)
    *H05K 7/14*    (2006.01)

(52) U.S. Cl.
    CPC .......... *G01R 31/2886* (2013.01); *H05K 7/1409* (2013.01)

(58) Field of Classification Search
    CPC ........... G01R 31/2863; G01R 1/07378; G01R 31/2891; G01R 31/2851; G01R 31/2868; G01R 31/003; G01R 31/26; G01R 31/31924; G01R 1/0483; G01R 1/0433; G01R 1/0466; G01R 31/2865; G01R 31/311; G01R 1/07328
    See application file for complete search history.

(56) References Cited

U.S. PATENT DOCUMENTS

| | | | |
|---|---|---|---|
| 4,683,424 A * | 7/1987 | Cutright et al. ............... | 324/537 |
| 6,910,162 B2 * | 6/2005 | Co et al. ........................ | 714/718 |

(Continued)

FOREIGN PATENT DOCUMENTS

| | | |
|---|---|---|
| JP | H08-062288 A | 3/1996 |
| JP | 2003-150274 A | 5/2003 |

(Continued)

OTHER PUBLICATIONS

Notification of Reasons for Refusal of Japanese Patent Application No. 2010-116617, issued by the Japanese Patent Office on Nov. 5, 2013.

(Continued)

*Primary Examiner* — Tung X Nguyen

(57) ABSTRACT

A test board can be inserted to a test head and removed from the test head while the connecting section for mounting thereon devices under test is mounted on the upper portion of the test head. A test head for retaining therein at least one test board for testing devices under test, includes: a casing provided with, on one side surface thereof, an opening through which the at least one test board is inserted and removed, the casing retaining therein the at least one test board with an upper side thereof oriented towards an upper surface of the casing; and a mounting member that guides a lower side of the at least one test board through the opening to a pre-set position, imposes an upward force to the lower side of the at least one test board, thereby mounting the at least one test board to the casing.

12 Claims, 11 Drawing Sheets

(56) References Cited

U.S. PATENT DOCUMENTS 7,215,556 B2 5/2007 Wrycraft
7,385,385 B2 6/2008 Magliocco

FOREIGN PATENT DOCUMENTS

| JP | 2005-321238 A | 11/2005 |
| JP | 2006-309856 A | 11/2006 |
| JP | 2007-322372 A | 12/2007 |
| JP | 4365213 B2 | 11/2009 |
| KR | 10-2008-0031137 A | 4/2008 |
| TW | 420304 U | 1/2001 |

OTHER PUBLICATIONS

Preliminary Notice of First Office Action for Taiwanese Patent Application No. 100108757, issued by the Taiwan Intellectual Property Office on Jul. 26, 2013.
International Preliminary Report on Patentability for International Application No. PCT/JP2011/000983 including Written Opinion of the International Searching Authority.
Notice of Office Action issued by the Korean Intellectual Property Office for application No. 10-2012-7003619.
International Search Report for International Application No. PCT/JP2011/000983 with a mailing date of May 31, 2011.

* cited by examiner

TEST HEAD, TEST BOARD AND TEST APPARATUS

BACKGROUND

1. Technical Field

The present invention relates to a test head, a test board and a test apparatus.

2. Related Art

A test apparatus for testing a semiconductor apparatus includes: a test head for retaining therein a test board that exchanges signals with devices under test; and a connecting section to mount thereon the devices under test. The connecting section to mount thereon the devices under test is mounted on the test head and electrically connects the devices under test to the test board.

Patent Document No. 1: U.S. Pat. No. 7,385,385
Patent Document No. 2: Japanese Patent No. 4365213

In conventional test apparatuses, a test board is mounted into a test head first, and thereafter a connecting section is mounted thereon for assuredly connecting the test board to the test head. With this conventional structure, so as to exchange the test board mounted to the test head, the connecting section has to be removed from the test head.

SUMMARY

Therefore, an aspect of the technical innovations herein is to provide a test head, a test board, and a test apparatus able to solve the above-mentioned problems. The aspect is achieved by combinations of the features recited in the claims. A first aspect of the innovations provides a test head for retaining therein at least one test board for testing devices under test, including: a casing provided with, on one side surface thereof, an opening through which the at least one test board is inserted and removed, the casing retaining therein the at least one test board with an upper side thereof oriented towards an upper surface of the casing; and a mounting member that guides a lower side of the at least one test board through the opening to a pre-set position, imposes an upward force to the lower side of the at least one test board, thereby mounting the at least one test board to the casing.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
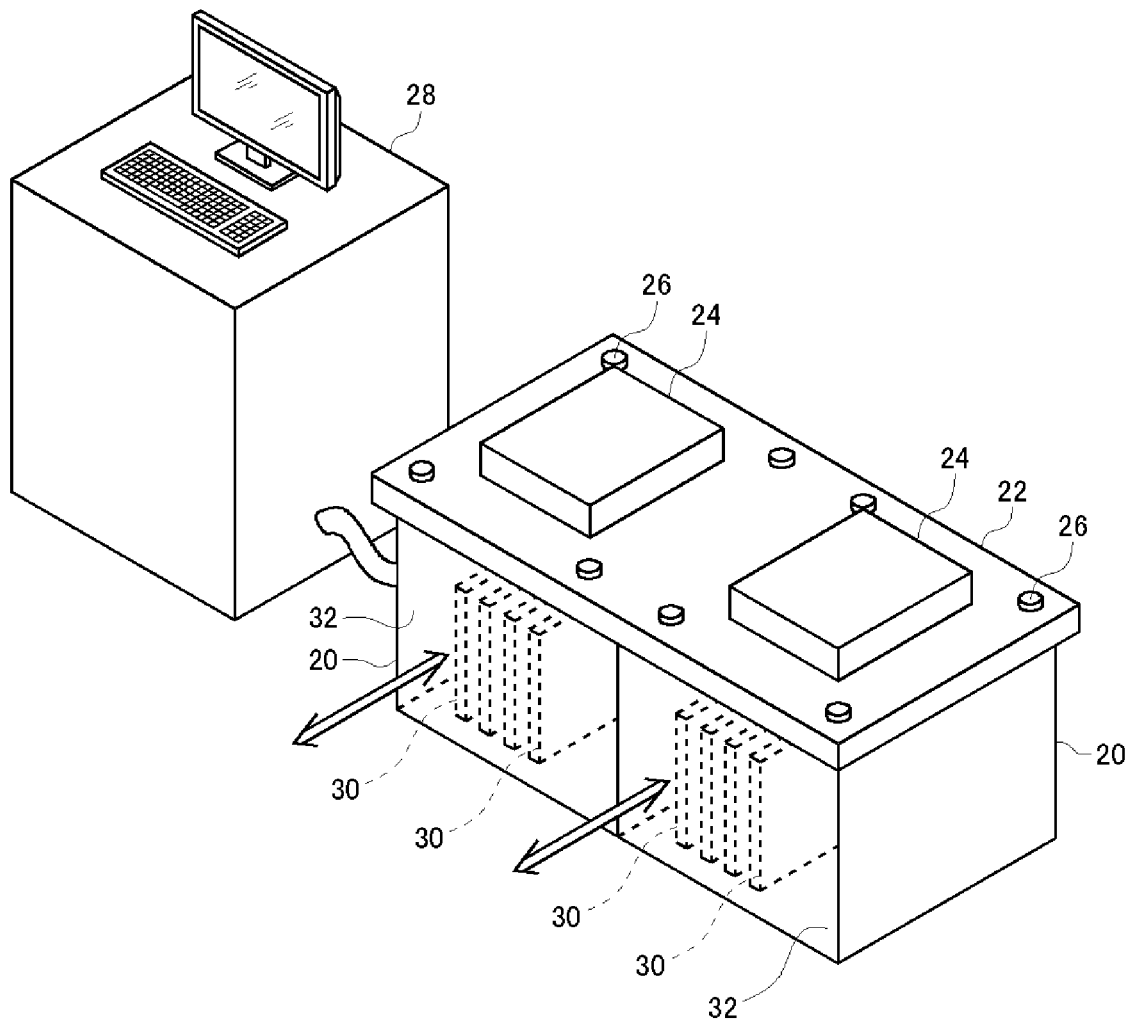
FIG. 1 shows a first example of the overview of a test apparatus 10 according to the present embodiment.

FIG. 1 shows a first example of the overview of a test apparatus 10 according to the present embodiment. The test apparatus 10 tests a plurality of devices under test in parallel. The test apparatus 10 includes a plurality of test heads 20, a single connecting section 22, a DUT board 24, a plurality of linking parts 26, and a control section 28.

Each of the plurality of test heads 20 retains at least one test board 30 for testing devices under test. The test board 30 determines acceptability of the devices under test whether it is good or bad, by exchanging signals with the devices under test.

The outer shape of each of the plurality of test heads 20 is the same cuboid. The plurality of test heads 20 are arranged so that their respective side surfaces 32 are connected to each other. Note that the test heads 20 are not mechanically fixed to each other.

The upper surface of the test head 20 is defined to be the surface on which to mount devices under test. The side surface 32 of the test head 20 is defined to be a surface that is vertical to the upper surface of the test head 20. The upper surface of the test head 20 needs not face against the ceiling during a test.

The connecting section 22 is mounted on the upper surfaces of the plurality of test heads 20 arranged next to each other, and the plurality of test heads 20 are fixed to the connecting section 22 independently from each other. In an example, the connecting section 22 is a member in a board shape having a size equal to or larger than the entire upper surfaces of the plurality of test heads 20 arranged next to each other. The connecting section 22 electrically connects each of the plurality of test boards 30 retained in a corresponding one of the plurality of test heads 20 to corresponding devices under test.

The DUT board 24 is mounted on the connecting section 22. The DUT board 24 mounts thereon a plurality of devices under test during a test. In this example, the test apparatus 10 includes a plurality of DUT boards 24 respectively corresponding to the plurality of test heads 20.

The plurality of linking parts 26 respectively connect the connecting section 22 with each of the plurality of test heads 20. In an example, each of the plurality of linking parts 26 is a bolt inserted from the upper side of the connecting section 22 to penetrate through the connecting section 22 thereby being screwed to the corresponding test head 20.

The control section 28 is connected to the test boards 30 in each of the plurality of test heads 20 via networking. The control section 28 controls a test performed through each of the plurality of test boards 30.

In the test apparatus 10 having the stated configuration, a test board 30 can be mounted on and removed from the side surface 32 of each of the plurality of test heads 20, with the connecting section 22 fixed thereto. For example, each of the plurality of test heads 20 has such a configuration that a plate forming the side surface 32 is removable, with the connecting section 22 fixed thereto. Each of the plurality of test heads 20 can insert a test board 30 inside and can remove the test board 30 from inside, via an opening formed by removing the plate forming the side surface 32.

In the test apparatus 10 having the stated configuration, the plurality of test heads 20 can be linked using a single connecting section 22. This enables the test apparatus 10 to increase the number of devices under test testable in parallel using the existing test heads 20. This further means that the test apparatus 10 can make best use of the existing equipment, as well as reducing the capital investment.

Figure 2:
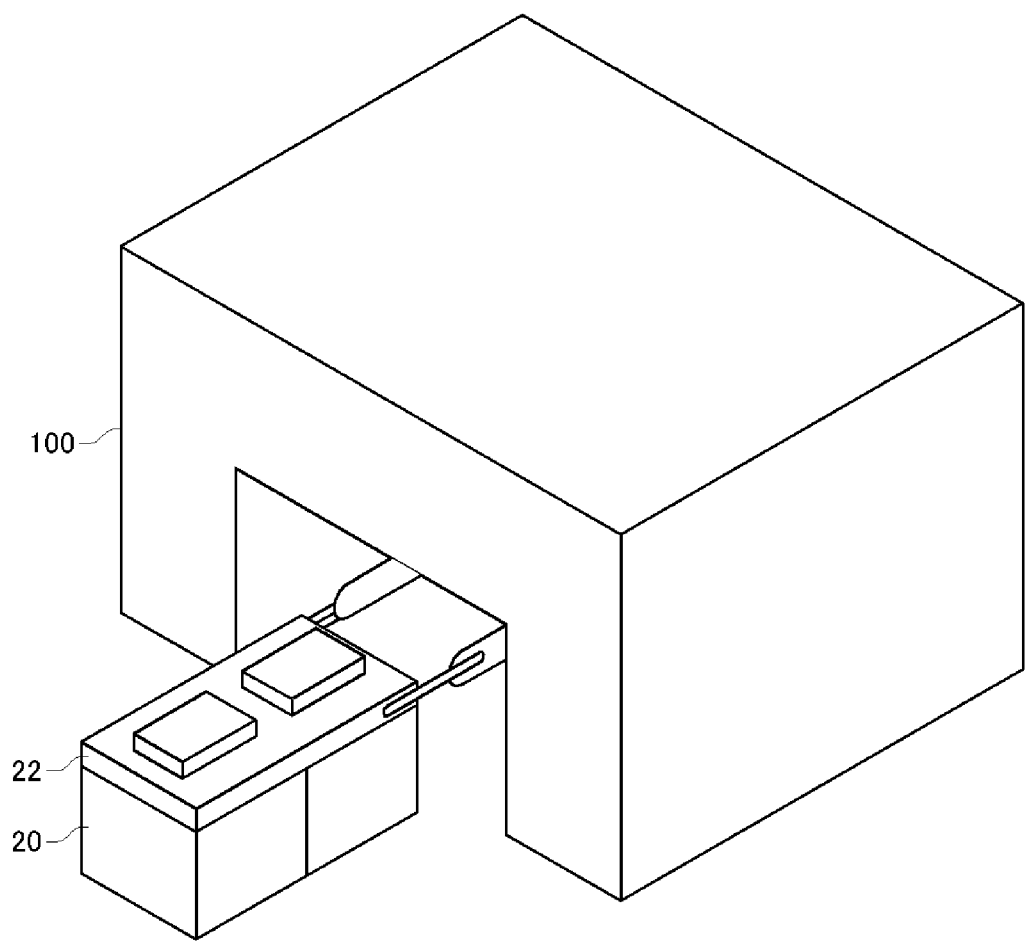
FIG. 2 shows a handler apparatus 100 as well as a test head 20 and a connecting section 22 according to the present embodiment.

FIG. 2 shows a handler apparatus 100 as well as test heads 20 and a connecting section 22 according to the present embodiment. In an example, the handler apparatus 100 is used to mount devices under test to the plurality of test heads 20 to which the connecting section 22 is connected. Here, prior to conducting a test, the plurality of test heads 20 to which the connecting section 22 is connected are moved to a position at which the handler apparatus 100 can load the devices under test onto the connecting section 22. In this case, the plurality of test heads 20 to which the connecting section 22 is connected are moved while retaining the connecting section 22.

For example, as FIG. 2 shows, the handler apparatus 100 grasps both sides of the connecting section 22, and moves the plurality of test heads 20 to which the connecting section 22 is connected, to a position at which the devices under test can be loaded onto the connecting section 22. Accordingly, even if the plurality of test heads 20 are not fixed to each other, the handler apparatus 100 can collectively move the plurality of test heads 20.

Figure 3:
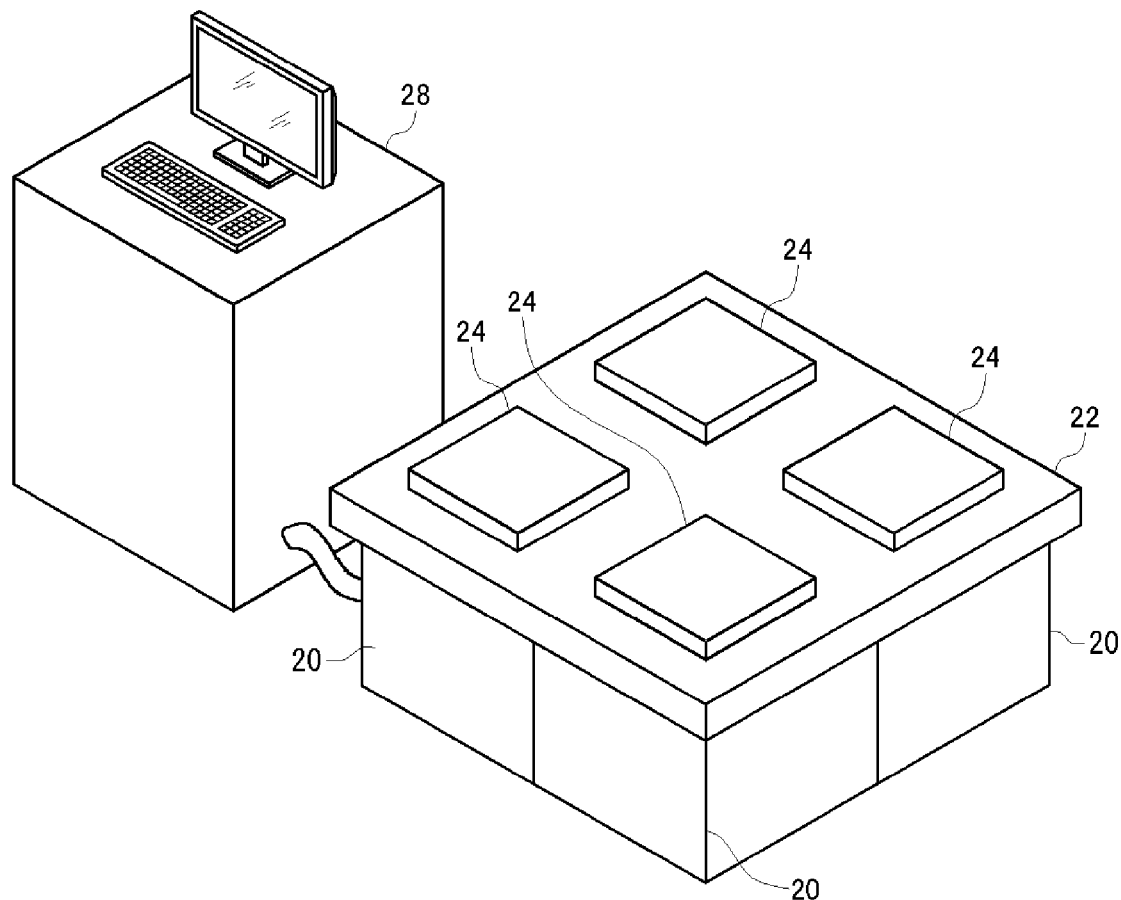
FIG. 3 shows a second example of the overview of the test apparatus 10 according to the present embodiment.
Figure 4:
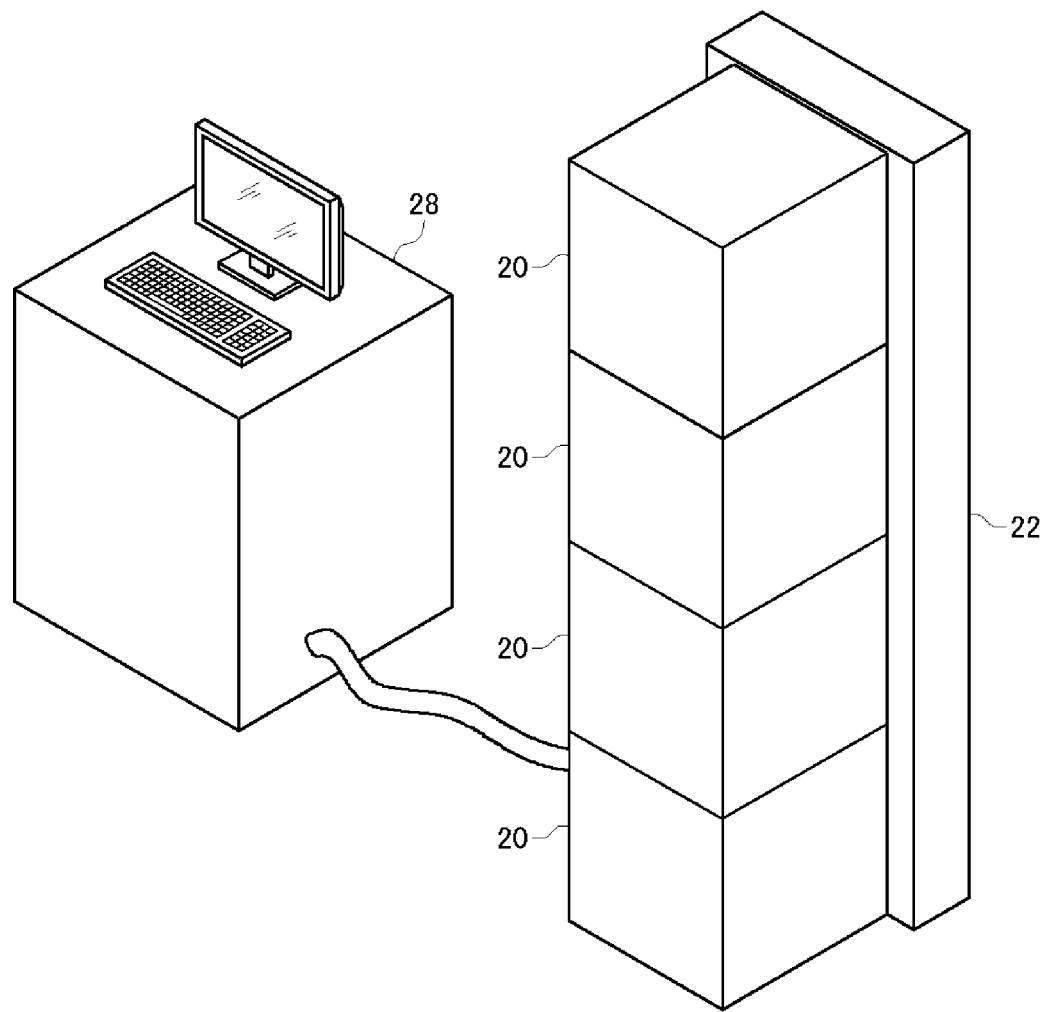
FIG. 4 shows a third example of the overview of the test apparatus 10 according to the present embodiment.

FIG. 3 shows a second example of the overview of the test apparatus 10 according to the present embodiment. FIG. 4 shows a third example of the overview of the test apparatus 10 according to the present embodiment.

Note that instead of the two test heads 20, the test apparatus 10 may be equipped with three or more test heads 20. In addition, the plurality of test heads 20 of the test apparatus 10 may be arranged in any manner, as long as their upper surfaces are oriented in the same direction.

In an example shown in FIG. 3, the test apparatus 10 has such a configuration that the four test heads 20 are arranged in two rows and two columns. In another example shown in FIG. 4, the test apparatus 10 has such a configuration that the four test heads 20 are arranged in one row. For example, the plurality of test heads 20 of the test apparatus 10 may be oriented towards the ceiling in the vertical direction, as shown in FIG. 4.

In this way, the test apparatus 10 can freely set the number and arrangement of the plurality of test heads 20. Therefore, the test apparatus 10 enables to combine the plurality of test heads 20 to have a size matching the specification or the like of the handler apparatus 100.

Figure 5:
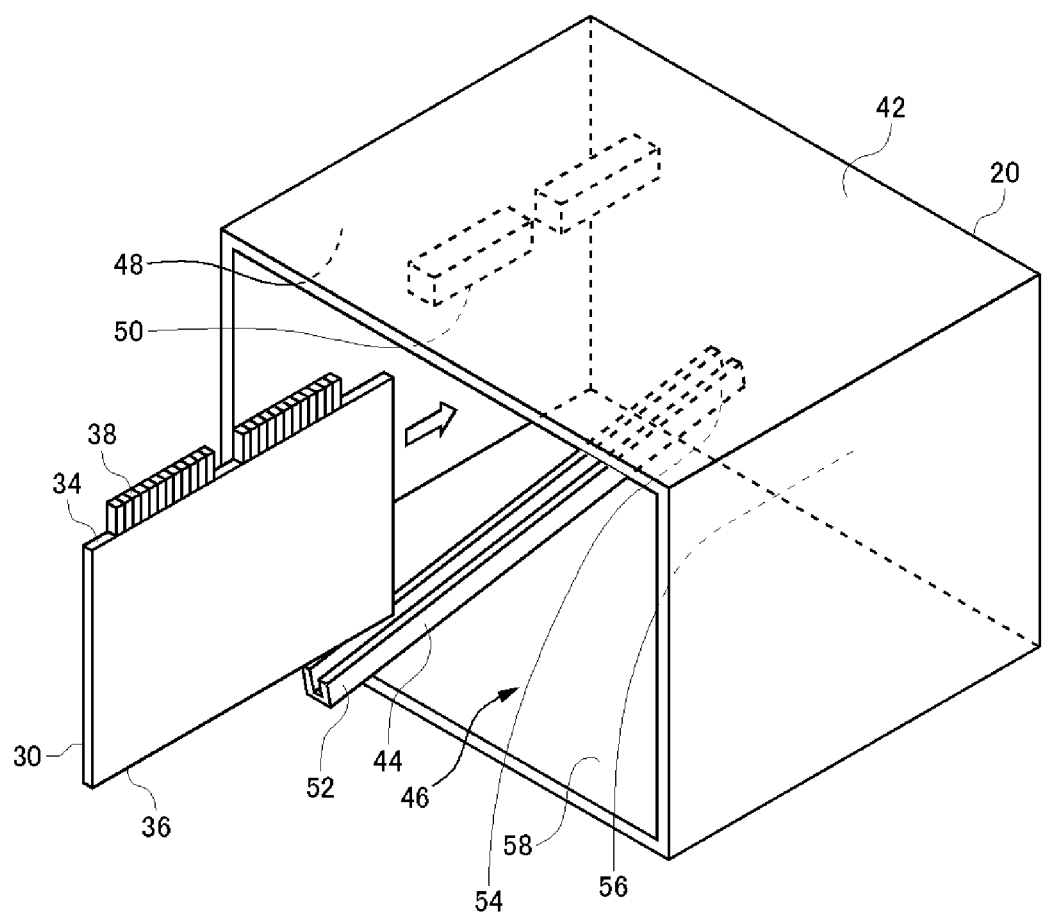
FIG. 5 shows a state in which a single test board 30 is being inserted into a test head 20 according to the present embodiment.
Figure 6:
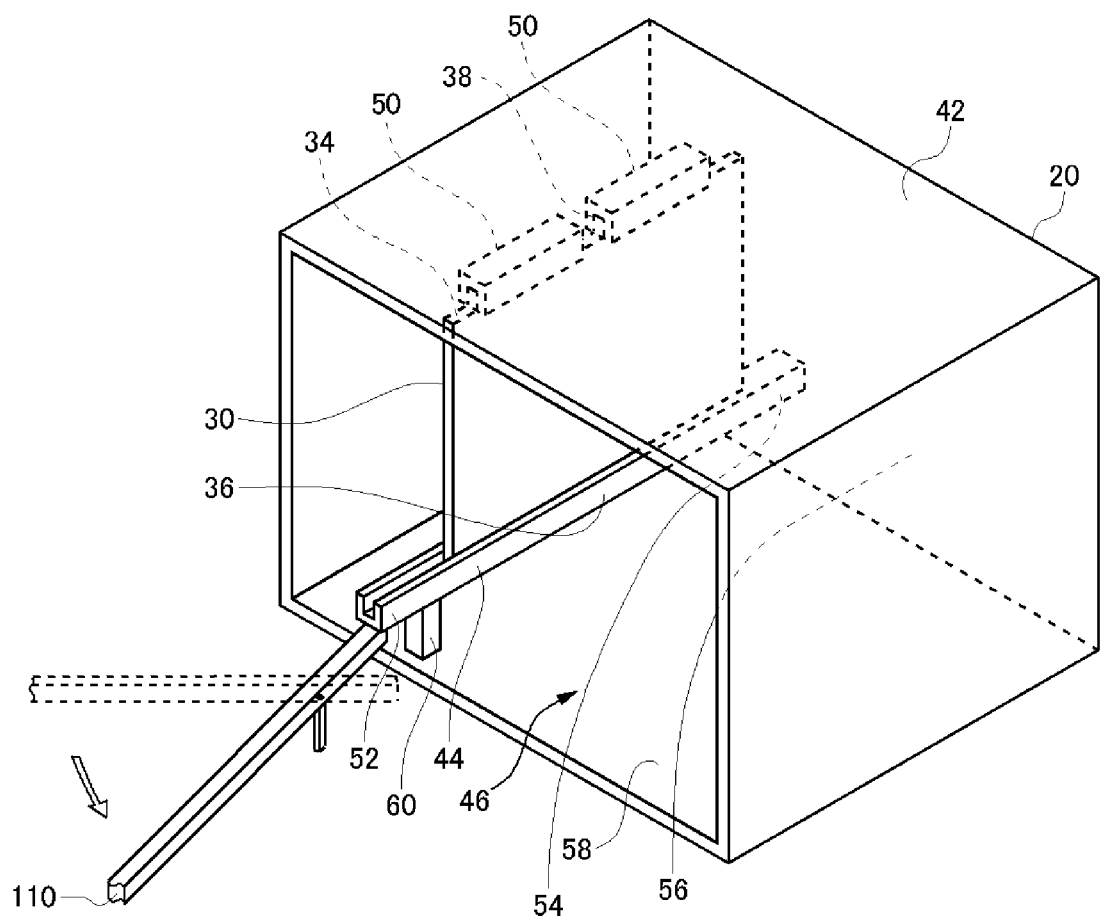
FIG. 6 shows a state in which a single test board 30 has been inserted into the test head 20 according to the present embodiment.

FIG. 5 shows a state in which a single test board 30 is being inserted into a test head 20 according to the present embodiment. FIG. 6 shows a state in which a single test board 30 has been inserted into the test head 20 according to the present embodiment.

The test head 20 includes a casing 42 and at least one mounting member 44.

The casing 42 is a hollow cuboid, and includes an opening 46 on one side surface 32, for inserting and removing a test board 30. The opening 46 is occluded by a plate during a test. In an example, the opening 46 is formed on one side surface 32 of the casing 42, by removing the plate at mounting or removal of the test board 30. Accordingly, the casing 42 can allow the test board 30 to be inserted inside through the side surface 32, and to remove the test board 30 through the side surface 32 from the inside.

During a test, the casing 42 retains the test board 30 in the state in which the upper side 34 of the test board 30 is oriented towards the upper surface 48. The test board 30 has, on the upper side 34, board connector(s) 38 to exchange signals with devices under test. The casing 42 has, on the upper surface 48, test-head connector(s) 50 at position(s) corresponding to the board connector(s) 38 when the test board 30 is moved to a pre-set position.

When a test board 30 is mounted on the upper surface 48 with its upper side 34 oriented towards the upper surface 48 of the casing 42 having the stated configuration, the test-head connectors 50 provided on the upper surface 48 are brought into electrical connection with the board connectors 38 provided on the upper side 34 of the test board 30. The test-head connectors 50 are in electrical connection to the connecting section 22 mounted on the upper portion of the casing 42. Therefore, the test board 30 can exchange signals with devices under test during a test.

When the test board 30 is attempted to be inserted into the casing 42, the mounting member 44 guides the lower side 36 of the test board 30, from the opening 46 to a pre-set position inside the casing 42. Subsequently, the mounting member 44 imposes an upward force to the lower side 36 of the test board 30 in the state inserted up to the pre-set position inside the casing 42, thereby mounting the test board 30 to the casing 42. More specifically, the mounting member 44 mounts the board connectors 38 provided on the upper side 34 of the test board 30 to the test-head connectors 50 provided on the upper surface 48 of the casing 42.

The mounting member 44 can also remove the test board 30 from the casing 42, by imposing a downward force to the test board 30 in the state mounted to the casing 42. More specifically, the mounting member 44 removes the board connectors 38 provided on the upper side 34 of the test board 30 from the test-head connectors 50 provided on the upper surface 48 of the casing 42.

In an example, the mounting member 44 has a substantially bar-like shape. One end 52 of the mounting member 44 is exposed outside the casing 42 through the opening 46. Furthermore, the mounting member 44 is attached to the casing 42 so that a pre-set height thereof from the lower surface 58 of the casing 42 is movable up and down.

In an example, the other end 54 of the mounting member 44 is attached to the surface (back surface 56) that is opposite to the opening 46. In this case, the other end 54 of the mounting member 44 is attached to a position at a pre-set height from the lower surface 58 of the casing 42. In an example, the other end 54 of the mounting member 44 is attached to the back surface 56 so that the end 52 is rotatable with its rotation center being the attachment position on the back surface 56 (i.e. the rotation center being at a pre-set height from the lower surface 58 of the casing 42).

The end 52 of such a mounting member 44 can be pushed upward when the test board 30 has been inserted from the opening 46 to inside of the casing 42 and positioned at a pre-set position, as shown in FIG. 6. In an example, the end 52 is pushed upward by a pry bar 110.

When the end 52 is pushed upward, the mounting member 44 will abut against the lower side 36 of the test board 30, to apply an upward force to the lower side 36 of the test board 30. Accordingly, the mounting member 44 can push up the lower side 36 of the test board 30 up to a pre-set height.

Therefore, by pushing up the lower side 36 of the test board 30 to the pre-set height, the mounting member 44 can mount the board connectors 38 of the test board 30 to the test-head connectors 50 on the upper surface 48 of the casing 42. In this way, the mounting member 44 can mount the test board 30 to the casing 42, by applying an upward force to the lower side 36 of the test board 30.

In addition, the end 52 of the mounting member 44 is lowered downward from the position in which the lower side 36 of the test board 30 is positioned at the pre-set height. In an example, the end 52 is lowered downward by the pry bar 110.

When the end 52 is lowered downward, the mounting member 44 will get hung up at a click formed on the lower side 36 of the test board 30, to apply a downward force to the lower side 36 of the test board 30. Accordingly, the mounting member 44 can lower down the lower side 36 of the test board 30 from the pre-set height.

By lowering down the lower surface 36 of the test board 30 from the pre-set height, the mounting member 44 can remove the board connectors 38 of the test board 30, from the test-head connectors 50 on the upper surface 48 of the casing 42. In this way, the mounting member 44 can remove the test board 30 from the casing 42, by applying a downward force to the lower side 36 of the test board 30.

The mounting member 44 further includes a fixing member 60, as shown in FIG. 6. The fixing member 60 fixes the end 52 of the mounting member 44 in the state that the lower side 36 of the test board 30 is pushed up to the pre-set height. In an example, the fixing member 60 is provided between the end 52 of the mounting member 44 and the lower surface 58 of the casing 42, to retain the test board 30 so as not to come down. Due to this configuration, the mounting member 44 can retain the test board 30 to prevent the board connectors 38 from falling off from the test-head connectors 50 while conducting a test.

The test apparatus 10, having the stated configuration, enables insertion and removal of the test board 30 with respect to the inside of the test head 20, while the connecting section 22 is mounted on the upper portion of the test head 20. Such a test apparatus 10 further facilitates easy exchange of the test board 30 without removing the connecting section 22 from the test head 20.

Figure 7:
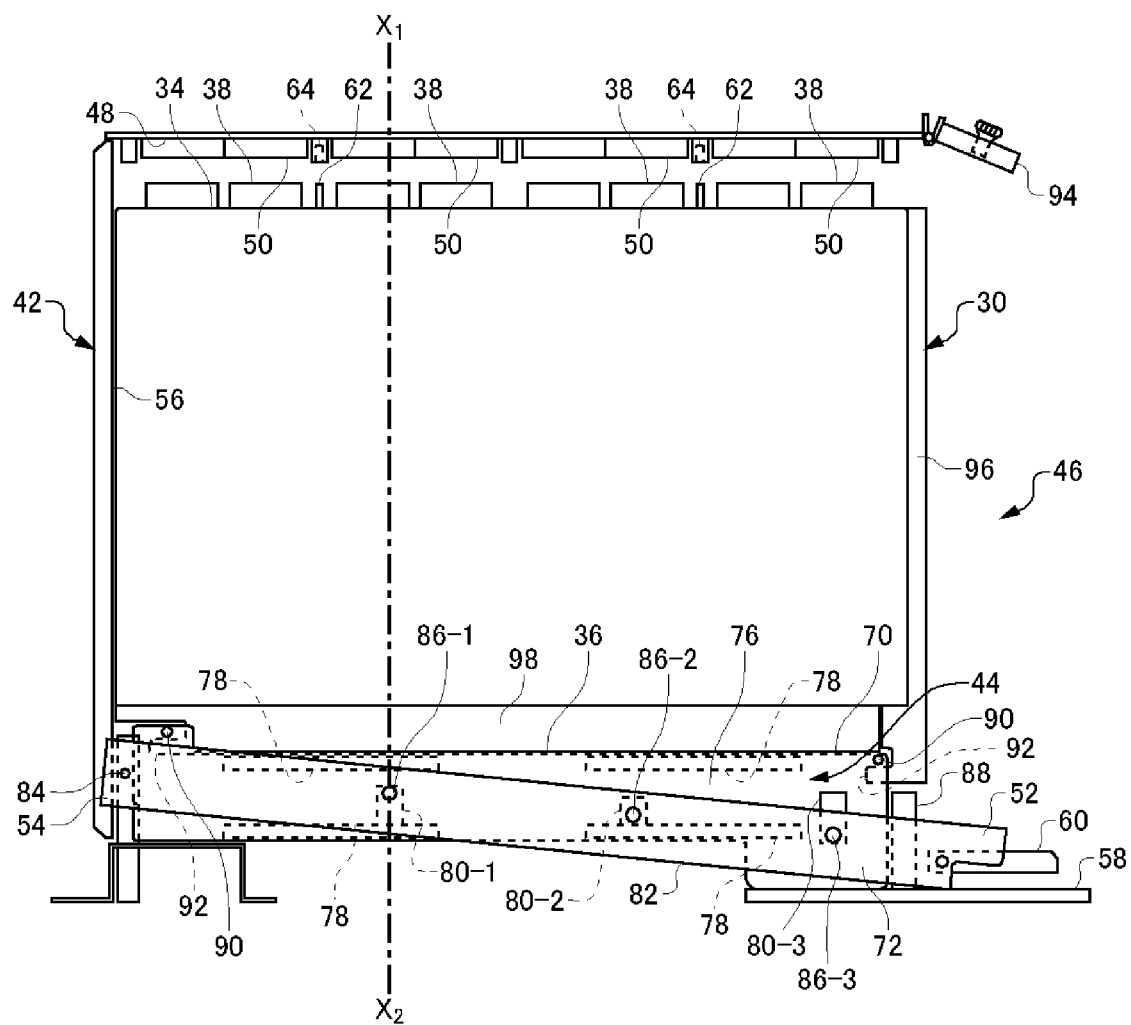
FIG. 7 shows a partial configuration of the test head 20 according to the present embodiment, containing a test board 30 therein and from which an end 52 of a mounting member 44 is lowered down.
Figure 8:
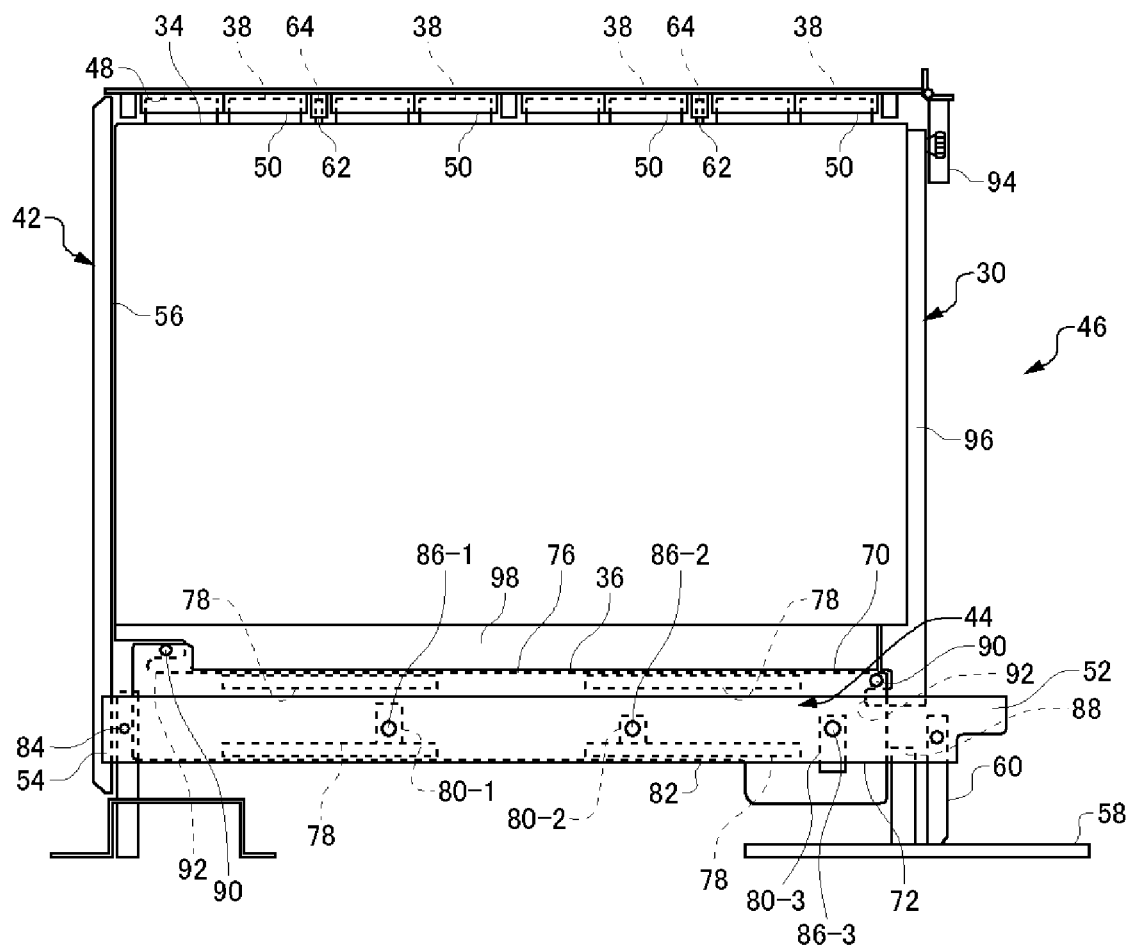
FIG. 8 shows a partial configuration of the test head 20 according to the present embodiment, containing a test board 30 therein with an end 52 of a mounting member 44 lifted up.
Figure 9:
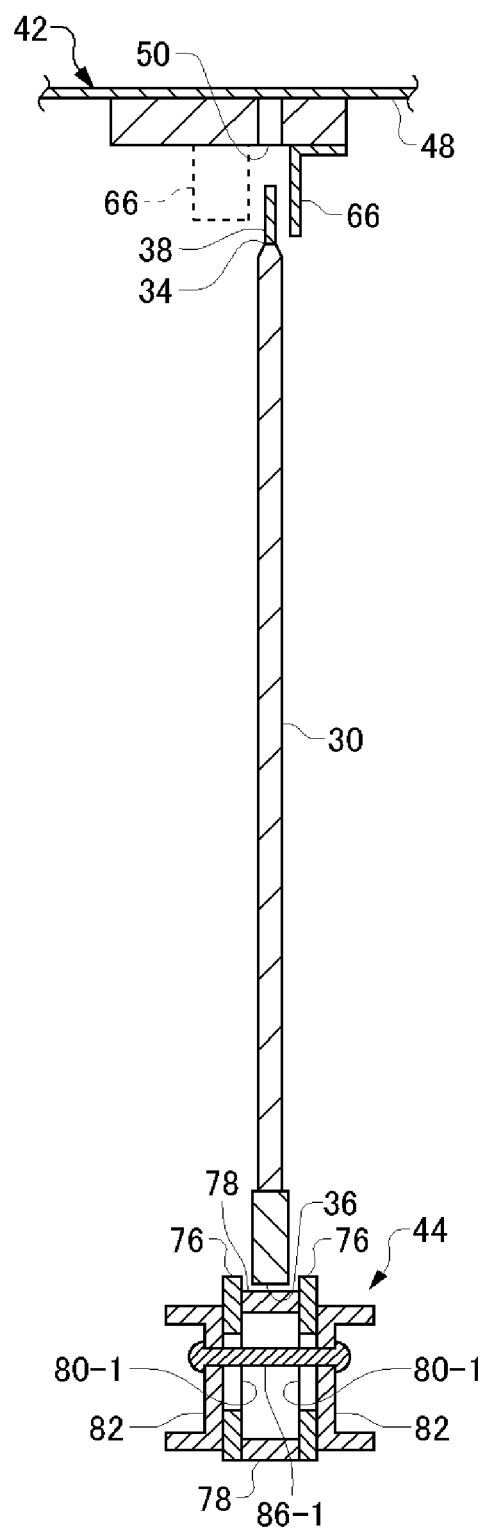
FIG. 9 shows a cross sectional view of FIG. 8 taken on the line X1-X2.
Figure 10:
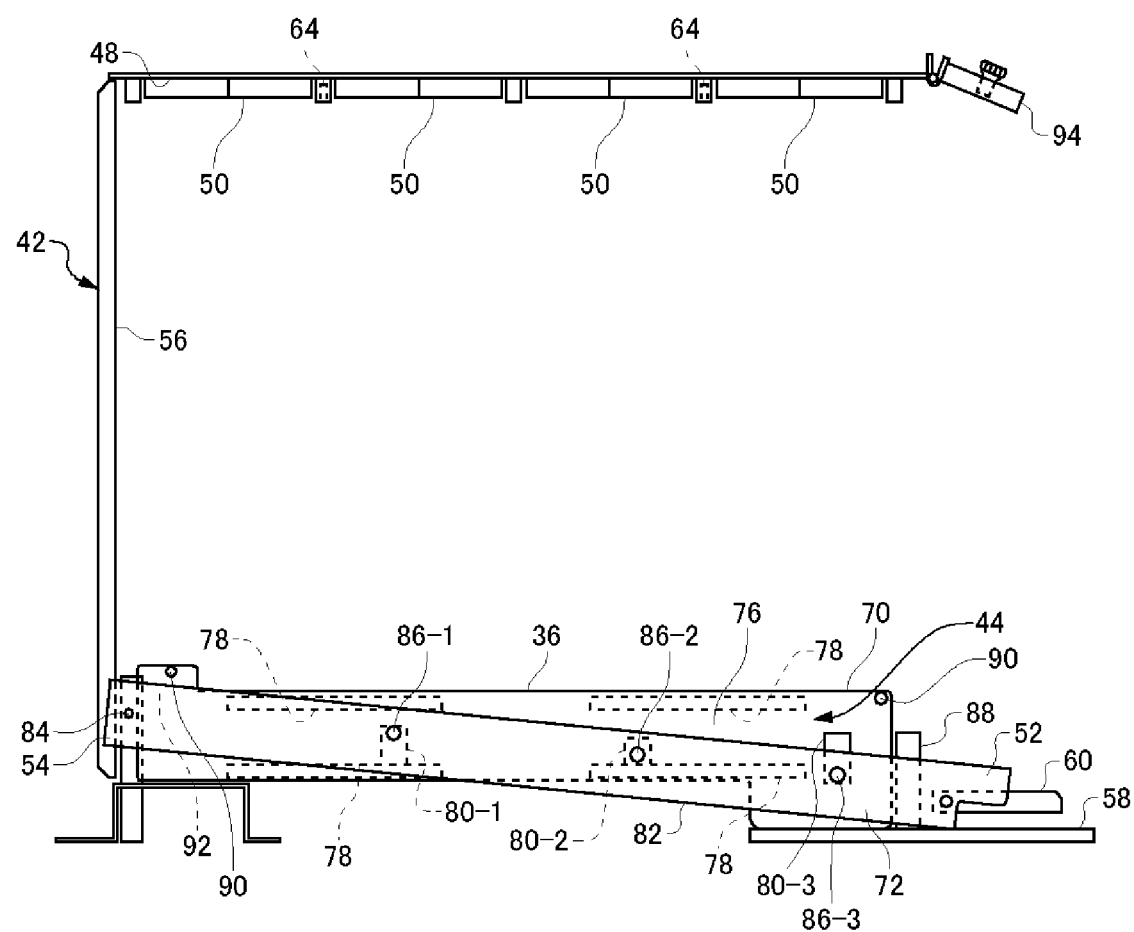
FIG. 10 shows a partial configuration of the test head 20 according to the present embodiment, not containing any test board 30 therein and from which an end 52 of a mounting member 44 is lowered down.
Figure 11:
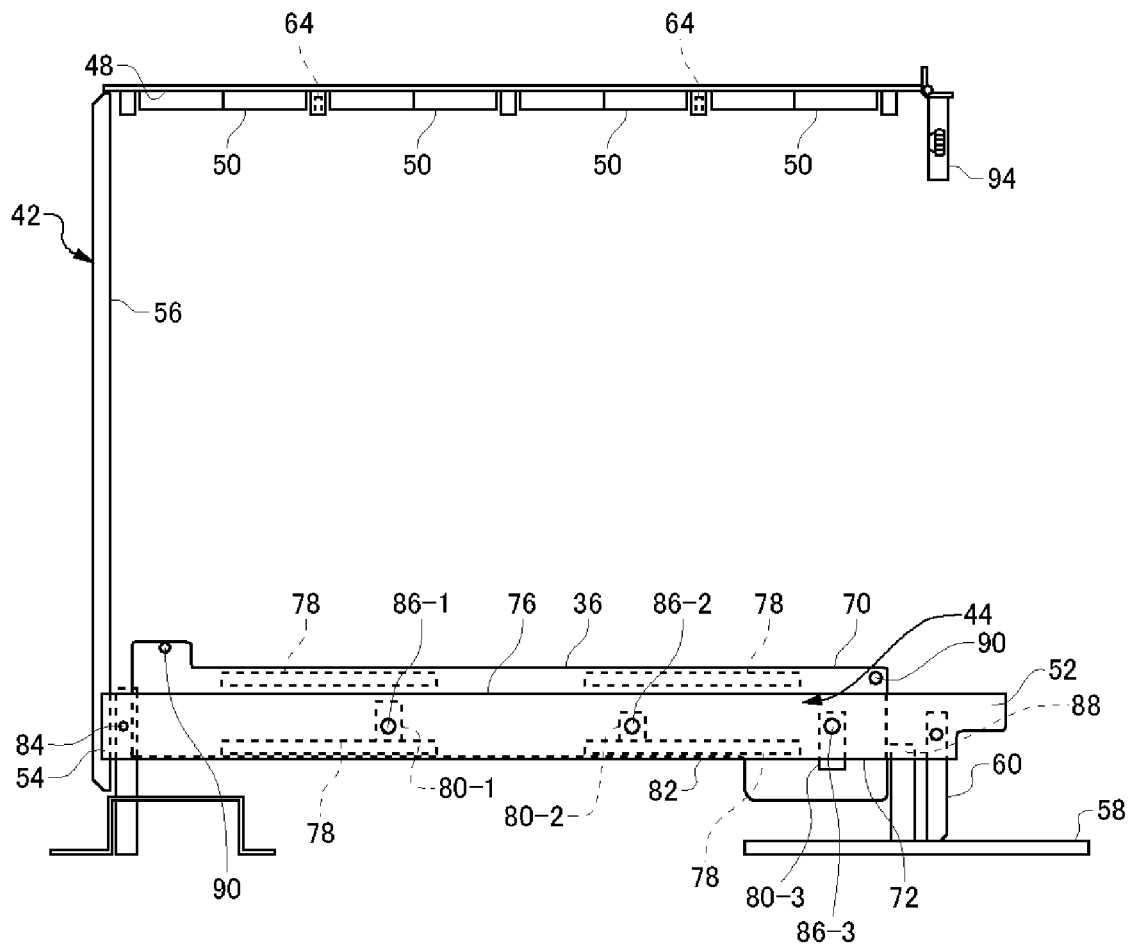
FIG. 11 shows a partial configuration of the test head 20 according to the present embodiment, not containing any test board 30 therein with an end 52 of a mounting member 44 lifted up.

FIG. 7 through FIG. 11 respectively show a partial configuration of the test head 20 according to the present embodiment. More specifically, FIG. 7 shows a partial configuration of the test head 20, containing a test board 30 therein and from which the end 52 of the mounting member 44 is lowered down. FIG. 8 shows a partial configuration of the test head 20, containing a test board 30 therein with the end 52 of the mounting member 44 lifted up. FIG. 9 shows a cross sectional view of FIG. 8 taken on the line X1-X2. FIG. 10 shows a partial configuration of the test head 20, not containing any test board 30 therein and from which the end 52 of the mounting member 44 is lowered down. FIG. 11 shows a partial configuration of the test head 20, not containing any test board 30 therein with the end 52 of the mounting member 44 lifted up.

The board connectors 38 are provided on the upper side 34 of the test board 30. The test-head connectors 50 are provided in positions corresponding to the board connectors 38 on the upper surface 48 of the casing 42. The board connectors 38 are mounted to the corresponding test-head connectors 50 in response to the test board 30 being raised up by the mounting member 44. The board connectors 38 and the test-head connectors 50 having the stated configuration can electrically connect the test board 30 to the connecting section 22 mounted on the upper portion of the test head 20.

Position alignment pins 62 are also provided on the upper side 34 of the test board 30. On the upper surface 48 of the casing 42, position alignment holes 64 are provided at positions corresponding to the position alignment pins 62. The position alignment pins 62 are inserted inside the corresponding position alignment holes 64, in response to the test board 30 being raised up by the mounting member 44. Such position alignment pins 62 and position alignment holes 64 guide the upper side 34 of the test board 30 to position as scheduled, to assuredly mount the board connectors 38 to the corresponding test-head connectors 50, when the test board 30 is pushed up by the mounting member 44.

An upper guiding section 66 is provided on the upper surface 48 of the casing 42, as shown in FIG. 9. The upper guiding section 66 sandwiches both surfaces of the test board 30 in the vicinity of the upper side 34 of the test board 30 to support the test board 30. Such an upper guiding section 66 can guide the upper side 34 of the test board 30 to position as scheduled, when the test board 30 is pushed up by the mounting member 44 and when the test board 30 is inserted inside the casing 42 through the opening 46.

The mounting member 44 includes a board supporting section 70 and a lever section 72. The board supporting section 70 guides the lower side 36 of the test board 30 through the opening 46 to a pre-set position, as well as providing a support to the lower side 36 of the test board 30 from below. The lever section 72 pushes up the board supporting section 70 by the force given from outside the casing 42, as well as supporting the board supporting section 70. In addition, using the force supplied from outside the casing 42, the lever section 72 lowers the board supporting section 70 having been pushed up to the pre-set height.

In an example, the board supporting section 70 includes two inner plates 76 and a plurality of intermediate members 78.

Each of the two inner plates 76 is a thin plate having the same, substantially elongated shape. The two inner plates 76 are arranged so that their planes are parallel to each other with a pre-set interval therebetween. The two inner plates 76 are arranged so that one end thereof in the direction of the longer side which is at the lower surface 58 side in the casing 42 is positioned nearer the opening 46 and the other end thereof is positioned to abut against the back surface 56. Furthermore, the two inner plates 76 are arranged so that their respective planes are parallel to the vertical direction of the casing 42 (i.e., the direction from the lower surface 58 to the upper surface 48 of the casing 42 or the reverse direction thereto).

The plurality of intermediate members 78 are positioned between the opposing planes of the two inner plates 76, to link the two inner plates 76. Each of the plurality of intermediate members 78 fixes the two inner plates 76 at an interval at least wider than the thickness of the lower side 36 portion of the test board 30. A part of the plurality of intermediate members 78 is positioned in the vicinity of the upper sides of the two inner plates 76.

A plurality of holes 80 are formed on the respective planes of the two inner plates 76 to align along the longer side. In this example, the two inner plates 76 respectively have a first hole 80-1 formed near the back surface 56, a second hole 80-2 formed at a substantially middle position, and a third hole 80-3 formed near the opening 46.

In addition, an engaging click 92 is formed on the lower side 36 of the test board 30, to lower down the test board 30. In addition, an engaging pin 90 is provided on the respective upper sides of the two inner plates 76 of the board supporting section 70. The engaging pin 90 engages with the engaging click 92 formed on the lower side of the test board 30, when the test board 30 is inserted up to a pre-set position in the casing 42.

The board supporting section 70 having the stated configuration can support the lower side 36 of the test board 30 inserted inside the casing 42 from below, to be parallel to the lower surface 58 and the upper surface 48, by means of the intermediate member 78 provided in the vicinity of the upper sides of the two inner plates 76. In addition, the vicinity portion of the upper sides of the two inner plates 76 and the intermediate member 78 form a groove in the board supporting section 70. By means of this groove, the board supporting section 70 can guide the lower side 36 of the test board 30 through the opening 46 to the pre-set position.

The lever section 72 includes two outer plates 82, a plurality of link pins 86, a displacement prevention section 88, and a fixing member 60.

Each of the two outer plates 82 has the same, substantially elongated shape. The two outer plates 82 support the board supporting section 70 by sandwiching it. More specifically, the two outer plates 82 support the two inner plates 76 provided parallel to each other by sandwiching them.

The two outer plates 82 are arranged so that one end 52 thereof in the direction of the longer side is exposed outside of the casing 42 through the opening 46, and the other end 54 thereof is attached to the back surface 56 opposite to the opening 46. The other end 54 of the two outer plates 82 is attached to the back surface 56 so that the end 52 can move up and down. In an example, the other end 54 of the two outer plates 82 is attached to the back surface 56 in a position at a pre-set height from the lower surface 58 of the casing 42, by means of the shaft 84. Accordingly, the two outer plates 82 are rotated with the shaft 84 working as the support point, thereby moving the end 52 up and down.

Each of the plurality of link pins 86 penetrates a corresponding one of the plurality of holes 80 formed on the board supporting section 70, to link the two outer plates 82. In this example, the lever section 72 includes a first link pin 86-1 penetrating the first hole 80-1, a second link pin 86-2 penetrating the second hole 80-2, and a third link pin 86-3 penetrating a third hole 80-3.

When the end 52 of the outer plates 82 moves upward, a part of the plurality of link pins 86 abuts against the upper portion of the corresponding hole(s) 80. Therefore, when the end 52 moves upward due to the force applied from outside the casing 42, the lever section 72 can in turn move the board supporting section 70 upward.

When the end 52 of the outer plates 82 moves downward, a part of the plurality of link pins 86 abuts against the lower portion of the corresponding hole(s) 80. Therefore, when the end 52 moves downward due to the force applied from outside the casing 42, the lever section 72 can move the board supporting section 70 downward.

The displacement prevention section 88 is provided on the lower surface 58, and restricts the end of the board supporting section 70 nearer the opening 46 from displacing towards outside the casing 42. Accordingly, the board supporting section 70 can be sandwiched by the displacement prevention section 88 and the back surface 56 respectively positioned at the longitudinal ends of the board supporting section 70. Therefore, the displacement prevention section 88 and the back surface 56 can move up and down the board supporting section 70 by keeping the board supporting section 70's orientation parallel to its the pre-movement orientation.

The fixing member 60 is inserted between the end 52 of the outer plates 82 and the lower surface 58, in the state in which the end 52 has been moved upward up to the pre-set position. Accordingly, the fixing member 60 can retain the outer plate 82 substantially parallel at the pre-set height. In addition, when the end 52 is moving downward from the pre-set position, the fixing member 60 is removed from the position between the end 52 and the lower surface 58. In an example, the fixing member 60 is a member fixed such that one end thereof is attached to the outer plate 82 to be foldable, and is folded at a right angle with respect to the outer plate 82 when the outer plate 82 is to be fixed in a parallel state.

In the lever section 72 having the stated configuration, the end 52 of the outer plate 82 can move in the upper direction. When the end 52 has moved in the upper direction, the lever section 72 can also move the board supporting section 70 in the upper direction. In this case, the board supporting section 70 can also be moved in the upper direction in a parallel state, by means of the displacement prevention section 88 and the back surface 56.

In the mentioned lever section 72, the end 52 of the outer plate 82 can also move in the lower direction below the pre-set height. When the end 52 has moved in the lower direction, the lever section 72 can also move the board supporting section 70 in the lower direction. In this case, the board supporting section 70 is also moved in the lower direction in a parallel state, by means of the displacement prevention section 88 and the back surface 56.

The mounting member 44 having the board supporting section 70 and the lever section 72 explained above are operated as follows. First, while the end 52 of the mounting member 44 is in contact with the lower surface 58 of the casing 42, a user inserts the test board 30 into the casing 42. In this case, the lower side of the test board 30 is inserted along the groove formed on the board supporting section 70, thereby guiding the test board 30 up to a pre-set position in the casing 42 by means of the mounting member 44.

Next, in the state in which the test board 30 has been inserted up to the pre-set position of the casing 42, the end 52 of the lever section 72 of the mounting member 44 is pushed upward by means of the pry bar 110 or the like. When the end 52 of the lever section 72 is pushed upward, a part of the plurality of link pins 86 abuts against the upper portion of the hole(s) 80, to move the board supporting section 70 in the upper direction. By moving upward, the board supporting section 70 can push up the lower side 36 of the test board 30 to the pre-set height. Accordingly, the board connectors 38 provided on the upper side 34 of the test board 30 are mounted to the test-head connectors 50 provided on the upper surface 48 of the casing 42. In this way, the mounting member 44 can mount the test board 30 inside the casing 42.

In the state in which the test board 30 is mounted to the casing 42, the end 52 of the lever section 72 of the mounting member 44 is lowered in the lower direction by means of the pry bar 110 or the like. When the end 52 of the lever section 72 is lowered downward, a part of the plurality of link pins 86 abuts against the lower portion of the hole(s) 80, to move the board supporting section 70 in the lower direction. By moving the board supporting section 70 in the lower direction, the engaging pin 90 is engaged with the engaging click 92 formed on the lower side 36 of the test board 30, to lower the test board 30 downward. When the test board 30 is lowered downward, the board connectors 38 are removed from the test-head connectors 50.

Then, the end 52 of the mounting member 44 is lowered to reach the lower surface 58 of the casing 42, a user takes out the test board 30 from the casing 42. The mounting member 44 allows removal of the test board 30 mounted in the casing 42 in the above way.

In one example, the test board 30 may have, at a lateral side thereof near the opening 46 in the state inserted to the casing 42, a lateral-side reinforcing section 96 for reinforcing the lateral side. The lateral-side reinforcing section 96 facilitates a user to retain the test board 30 when the user attempts to insert the test board 30 into the casing 42.

Also in one example, the test board 30 may have, at a lower side 36 thereof, a lower-side reinforcing section 98 for reinforcing the lower side 36. When the casing 42 pushes up the test board 30, the lower-side reinforcing section 98 helps secure mounting of the board connectors 38 to the test-head connectors 50, by applying a relatively strong force onto the test board 30.

The test head 20 may further include a falling-off prevention section 94 for restricting the test board 30, which has already been mounted in the casing 42, from falling off through the opening 46 to outside. For example, the falling-off prevention section 94 may be attached to the upper surface 48 of the casing 42 near the opening 46, using a hinge or the like. Then, when the test board 30 has been mounted to the casing 42, the falling-off prevention section 94 is screwed to the test board 30 to prevent it from falling off from the casing 42 to outside. The screw of the falling-off prevention section 94 is removed, to mount or remove the test board 30.

The test board 30 can be inserted to the test head 20 described above and removed from the test head 20 while the connecting section 22 is mounted on the upper portion of the test head 20. This further facilitates easy exchange of the test board 30 without removing the connecting section 22 from the test head 20.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A test head for retaining therein at least one test board for testing devices under test, comprising:
a casing provided with, on one side surface thereof, an opening through which the at least one test board is inserted and removed, the casing retaining therein the at least one test board with an upper side thereof oriented towards an upper surface of the casing; and
a mounting member that guides a lower side of the at least one test board through the opening to a pre-set position and imposes an upward force to the lower side of the at least one test board, thereby mounting the at least one test board to the casing, wherein
the at least one test board includes, on an upper side thereof, board connectors to exchange signals with the devices under test,
the casing has, on the upper surface, test-head connectors at positions corresponding to the board connectors when the at least one test board is moved to a pre-set position,
the mounting member mounts the board connectors of the test board onto the test-head connectors on the upper surface of the casing, and
the mounting member includes:
a board supporting section that guides the lower side of the test board through the opening to a pre-set position and provides a support to the lower side of the test board from below; and
a lever section that pushes up the board supporting section by a force given from outside the casing, and supports the board supporting section.

2. The test head according to claim 1, wherein
one end of the lever section is exposed outside the casing through the opening, and the other end of the lever section is attached to a surface opposite to the opening, so that the one end can move up and down.

3. The test head according to claim 2, wherein
the lever section is attached to the surface opposite to the opening in a position at a pre-set height from a lower surface of the casing.

4. The test head according to claim 3, wherein
by the lower side of the test board being pushed up to a pre-set height when the test board is positioned at a pre-set position of the board supporting section, the lever section mounts the board connectors of the test board onto the test-head connectors on the upper surface of the casing.

5. The test head according to claim 4, wherein
the mounting member further includes a fixing member that fixes the one end of the lever section in a state in which the lower side of the test board is pushed up to the pre-set height.

6. The test head according to claim 5, wherein
when the mounting member moves down the lower side of the test board from the pre-set height into a lower direction, the mounting member also moves the board supporting section in the lower direction, and
the board supporting section, when moving down, applies a downward force to the test board.

7. The test head according to claim 6, wherein
the board supporting section includes an engaging pin that is engaged with the lower side of the test board, when the board supporting section has moved in a lower direction.

8. The test head according to claim 1, further comprising:
a falling-off prevention section that restricts the test board mounted in the casing, from falling off through the opening to outside.

9. A test board mounted to the test head according to claim 1.

10. The test board according to claim 9 comprising a lower-side reinforcing section that reinforces the lower side.

11. A test board mounted to the test head according to claim 7 provided with an engaging click on the lower side.

12. A test apparatus for testing devices under test, comprising:
   the test head according to claim 1;
   a connecting section that is provided on the test head, mounts thereon the devices under test, and connects the devices under test to the test board in the test head; and
   a control section that controls a test performed through the test board.

* * * * *